(12) United States Patent
He (10) Patent No.: US 10,497,890 B2
(45) Date of Patent: Dec. 3, 2019

(54) QUANTUM-DOT ELECTROLUMINESCENT DEVICE, METHOD FOR PREPARING THE SAME, AND DISPLAY DEVICE

(71) Applicant: BOE TECHNOLOGY GROUP CO., LTD., Beijing (CN)

(72) Inventor: Yuedi He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/567,718

(22) PCT Filed: May 23, 2017

(86) PCT No.: PCT/CN2017/085511
§ 371 (c)(1),
(2) Date: Oct. 19, 2017

(87) PCT Pub. No.: WO2018/001000
PCT Pub. Date: Jan. 4, 2018

(65) Prior Publication Data
US 2019/0115555 A1  Apr. 18, 2019

(30) Foreign Application Priority Data

Jul. 1, 2016 (CN) .......................... 2016 1 0515913

(51) Int. Cl.
*H01L 29/08* (2006.01)
*H01L 51/50* (2006.01)
(Continued)

(52) U.S. Cl.
CPC ........ *H01L 51/5036* (2013.01); *H01L 51/502* (2013.01); *H01L 51/5012* (2013.01);
(Continued)

(58) Field of Classification Search
CPC ............... H01L 51/502; H01L 51/5056; H01L 51/5088; H01L 51/56
(Continued)

(56) References Cited

U.S. PATENT DOCUMENTS 9,899,610 B2 * 2/2018 Lee ..................... H01L 51/0072
9,954,177 B2 * 4/2018 Ishisone .............. H01L 51/0051
(Continued)

FOREIGN PATENT DOCUMENTS

| CN | 105199724 A | 12/2015 |
|----|-------------|---------|
| CN | 105226159 A | 1/2016 |

(Continued)

OTHER PUBLICATIONS

First Office Action for Chinese Application No. 201610515913.6, dated Aug. 2, 2017, 6 Pages.
(Continued)

*Primary Examiner* — Tan N Tran
(74) *Attorney, Agent, or Firm* — Brooks Kushman P.C.

(57) ABSTRACT

The present disclosure provides a quantum-dot electroluminescent device, including a light-emitting layer, wherein the light-emitting layer is made of a thermally activated delayed fluorescence material and a quantum-dot light-emitting material which are capable of emitting white light by mixing together in proportion in case of excitation.

18 Claims, 5 Drawing Sheets

(51) Int. Cl.
*H01L 51/56* (2006.01)
*H01L 51/00* (2006.01)

(52) U.S. Cl.
CPC ...... *H01L 51/5056* (2013.01); *H01L 51/5088* (2013.01); *H01L 51/56* (2013.01); *H01L 51/006* (2013.01); *H01L 51/0035* (2013.01); *H01L 51/0036* (2013.01); *H01L 51/0037* (2013.01); *H01L 51/0039* (2013.01); *H01L 51/0043* (2013.01); *H01L 51/0052* (2013.01); *H01L 51/0065* (2013.01); *H01L 51/0067* (2013.01); *H01L 2251/558* (2013.01)

(58) Field of Classification Search
USPC .............................................. 257/40, 59, 72
See application file for complete search history.

(56) References Cited

U.S. PATENT DOCUMENTS 9,960,363 B2 * 5/2018 Eum .................... C07D 239/26

| | | |
|---|---|---|
| 2016/0028022 A1 | 1/2016 | Seo et al. |
| 2017/0084844 A1 | 3/2017 | Parham et al. |

FOREIGN PATENT DOCUMENTS

| | | |
|---|---|---|
| CN | 105276526 A | 1/2016 |
| CN | 105304825 A | 2/2016 |
| CN | 105514294 A | 4/2016 |
| CN | 105552245 A | 5/2016 |
| CN | 106229423 A | 12/2016 |
| JP | 2009087756 A | 4/2009 |
| WO | 2015135625 A1 | 9/2015 |

OTHER PUBLICATIONS

International Search Report and Written Opinion for Application No. PCT/CN2017/085511, dated Aug. 4, 2017, 9 Pages.

* cited by examiner

QUANTUM-DOT ELECTROLUMINESCENT DEVICE, METHOD FOR PREPARING THE SAME, AND DISPLAY DEVICE

CROSS-REFERENCE TO RELATED APPLICATIONS

This application is the U.S. national phase of PCT Application No. PCT/CN2017/085511 filed on May 23, 2017, which claims priority to Chinese Patent Application No. 201610515913.6 filed on Jul. 1, 2016, which are incorporated herein by reference in their entireties.

TECHNICAL FIELD

The disclosure relates to a field of display techniques, and in particular to a quantum-dot electroluminescent device, a method for preparing the same, and a display device.

BACKGROUND

Currently, in order for the quantum-dot electroluminescent device to emit white light, a method of stacking quantum-dot red, blue and green emitting layers is mainly adopted, i.e., the white light is obtained by mixing three primary colors. The white light obtained through this method, emitted by the quantum-dot electroluminescent device, has a chromaticity which tends to vary with an applied voltage. In addition, the preparation of a light-emitting layer with a multilayer structure leads to complexity of the process and high costs.

SUMMARY

The technical problem to be solved by the present disclosure is to provide a quantum-dot electroluminescent device which may emit white light by adopting a single light-emitting layer, without preparing three primary emitting layers separately, and has a simple structure and a high luminous efficiency.

The present disclosure discloses a quantum-dot electroluminescent device, including a light-emitting layer, wherein the light-emitting layer is made of a thermally activated delayed fluorescence material and a quantum-dot light-emitting material which are capable of emitting white light by mixing together in proportion in case of excitation.

Optionally, the thermally activated delayed fluorescence material has an emission spectrum that matches an absorption spectrum of the quantum-dot light-emitting material.

Optionally, the thermally activated delayed fluorescence material is capable of emitting blue light and exciting the quantum-dot light-emitting material to emit red and green light. Further, the thermally activated delayed fluorescence material is made of propiconazole-sulfobenzide, and the quantum-dot light-emitting material is made of CdSe/ZnS or ZnSe:$Cu^{2+}$.

Optionally, the thermally activated delayed fluorescence material is capable of emitting green light, and the quantum-dot light-emitting material is capable of emitting orange light.

Optionally, the proportion of the quantum-dot light-emitting material to the thermally activated delayed fluorescence material is 0.1%-50% by mass.

Optionally, the quantum-dot electroluminescent device further includes a cathode, an electron injection layer, an electron transport layer, a hole transport layer, a hole injection layer and an anode, wherein the electron injection layer, the electron transport layer, the light-emitting layer, the hole transport layer and the hole injection layer are sequentially arranged between the cathode and the anode.

Optionally, the electron transport layer is made of metallic oxide, metal composite oxide, metal complex or an organic material.

Optionally, the electron transport layer has a thickness in a range of 20 nm to 500 nm.

Optionally, the hole transport layer is made of any one of the following materials: (9,9-dioctylfluorene)-(4,4'-N-isobutylbenzene-diphenylamine) copolymer (TFB), poly-triphenyl diamine derivatives (poly-TPD), N,N'-diphenyl-N,N' (α-naphtyl)-1,1'-biphenyl-4,4'-diamine (NPD), and N,N'-diphenyl-N,N'-(1-naphthyl)-1,1'-biphenyl-4,4'-diamine (NPB).

Optionally, the hole transport layer has a thickness in a range of 20 nm to 200 nm.

Optionally, the hole injection layer is made of poly (3,4-ethylendioxythiophene)-poly (styrene sulfonic acid).

Optionally, the hole injection layer has a thickness in a range of 1 nm to 100 nm.

Optionally, the electron injection layer has a thickness in a range of 0.5 to 3 nm, and the electron transport layer has a thickness in a range of 20 to 500 nm.

Optionally, the anode has a thickness in a range of 100 nm to 300 nm, and the cathode has a thickness in a range of 100 nm to 200 nm.

The present disclosure discloses a method for preparing a quantum-dot electroluminescent device, including following steps: providing a base substrate; preparing an anode on the base substrate; forming a hole injection layer on the anode; forming a hole transport layer on the hole injection layer; solving a thermally activated delayed fluorescence material and a quantum-dot light-emitting material in an organic solution, spin-coating a mixed solution on the hole transport layer, and obtaining a light-emitting layer after drying, wherein the thermally activated delayed fluorescence material and the quantum-dot light-emitting material are capable of emitting the white light by mixing together in proportion in case of excitation; forming an electron transport layer on the light-emitting layer; forming an electron injection layer on the electron transport layer; and preparing a cathode on the electron injection layer, to obtain the quantum-dot electroluminescent device.

Optionally, the thermally activated delayed fluorescence material and the quantum-dot light-emitting material are solved in the organic solution, so as to prepare the mixed solution with a concentration in a range of 5 mg/ml to 15 mg/ml.

Optionally, the proportion of the quantum-dot light-emitting material to the thermally activated delayed fluorescence material is 0.1%-50% by mass.

Optionally, the forming a hole transport layer on the hole injection layer includes: spin-coating a solution for preparing the hole transport layer on the hole injection layer at a speed ranging from 2000 to 4000 rpm.

The present disclosure discloses a display device, including any one of the above-mentioned quantum-dot electroluminescent devices.

The light-emitting layer included in the quantum-dot electroluminescent device according to the present disclosure is made of the thermally activated delayed fluorescence material and the quantum-dot light-emitting material which are capable of emitting white light by mixing together in proportion in case of excitation. In addition to its self-emissive property, the thermally activated delayed fluorescence material may transfer exciton energy to the quantum-dot light-emitting material, so as to excite the same to emit light more sufficiently. The light emitted by the thermally activated delayed fluorescence material is combined with the light emitted by the quantum dot in case of excitation to obtain the white light. Further, by appropriately adjusting a doping ratio of the thermally activated delayed fluorescence material with the quantum-dot light-emitting material and an applied voltage, the luminous efficiency of the light-emitting device may be enhanced.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure. Based on the embodiments of the present disclosure, any other embodiments obtained by a person skilled in the art without any creative effort shall fall within the protection scope of the present disclosure.

Some embodiment of the present disclosure provides a light-emitting layer (applicable to the quantum-dot electroluminescent device), made of a thermally activated delayed fluorescence material and a quantum-dot light-emitting material which are capable of emitting white light by mixing together in proportion. For example, the thermally activated delayed fluorescence material and the quantum-dot light-emitting material are capable of emitting white light by mixing together in proportion in case of excitation.

The quantum-dot light-emitting material is a quasi-zero-dimensional semiconductor material, including a small amount of atoms or atomic groups, usually with a size in three dimensions ranging from 1 nm to 10 nm. Due to its advantages such as high excitation purity, high luminous efficiency, narrow half-peak width, pure color, adjustable emitted color, or the like, the quantum dot becomes a research hotspot in terms of the light-emitting material.

The quantum-dot electroluminescent device is a new light-emitting device which uses the quantum-dot light-emitting material as a light-emitting layer to be applied to an organic or polymer electroluminescent device. Due to different particle sizes of the quantum-dot light-emitting material as the light-emitting layer, the electroluminescent device emits light of different colors. A white quantum-dot electroluminescent device based on the quantum-dot light-emitting material has a promising application prospect in a display and lighting field.

The thermally activated delayed fluorescence material is an organic small-molecule material with a relatively small singlet-triplet energy difference ($\Delta E$–ST). A triplet exciton of such a material may be converted to a singlet exciton through reverse intersystem crossing (RISC) subjected to an environment thermal energy.

The light-emitting layer of the quantum-dot electroluminescent device according to the present disclosure may emit the white light by mixing the thermally activated delayed fluorescence material and the quantum-dot light-emitting material together in proportion, which may enhance the luminous efficiency of the light-emitting device, and realize the white light emitted by the single light-emitting layer, thereby simplifying the process and lowering the costs.

Optionally, the present disclosure discloses a quantum-dot electroluminescent device, including a cathode, an electron injection layer, an electron transport layer, a light-emitting layer, a hole transport layer, a hole injection layer and an anode which are sequentially arranged, wherein the light-emitting layer is made of a thermally activated delayed fluorescence material and a quantum-dot light-emitting material which are capable of emitting white light by mixing together in proportion.

Figure 1:
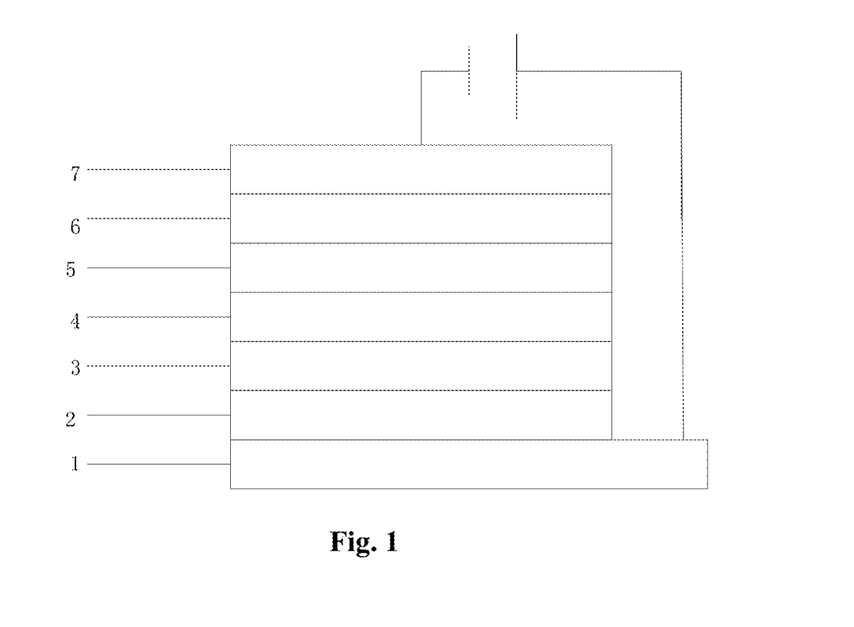
FIG. 1 is a structural schematic diagram of a quantum-dot electroluminescent device according to some embodiments of the present disclosure.

FIG. 1 is a structural schematic diagram of a quantum-dot electroluminescent device according to the present disclosure. In FIG. 1, the anode is denoted by the reference numeral 1, the hole injection layer by 2, the hole transport layer by 3, the light-emitting layer by 4, the electron transport layer by 5, the electron injection layer by 6, and the cathode by 7.

In the present disclosure, the material of the light-emitting layer is improved, since it is made of the thermally activated delayed fluorescence material and the quantum-dot light-emitting material which are capable of emitting white light by mixing together in proportion.

Figure 2:
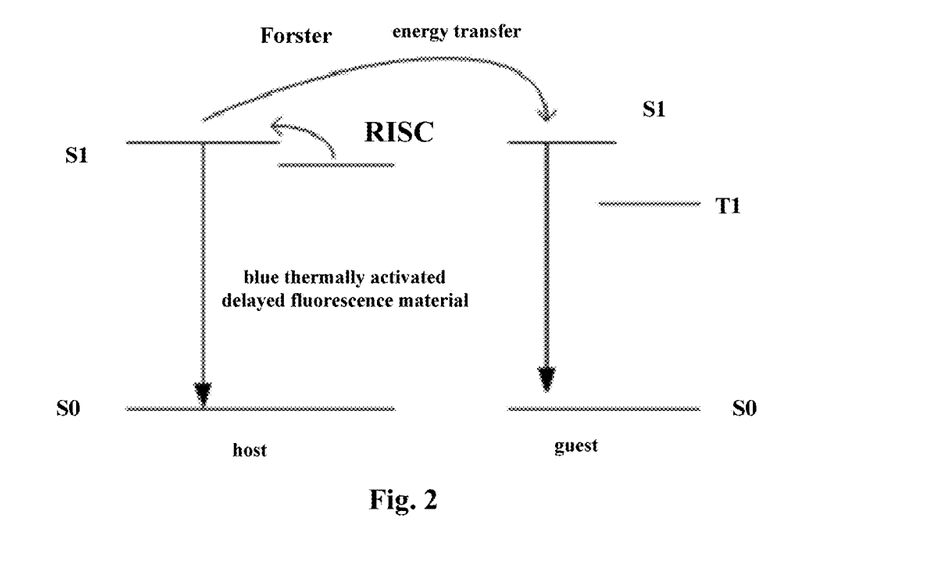
FIG. 2 is a schematic diagram showing a principle of a light-emitting layer.

FIG. 2 is a schematic diagram showing a principle of a light-emitting layer.

In the present disclosure, the thermally activated delayed fluorescence material is taken as a host material, and the quantum-dot light-emitting material as a guest material. In case of electric injection, the ratio of a single excited state to a triplet excited state generated in the thermally activated delayed fluorescence material as the host material is 1:3. The thermally activated delayed fluorescence material with a relatively small singlet-triplet energy difference subjected to the environment thermal energy has its triplet excited state converted into the single excited state through the reverse intersystem crossing. In the case that there exists a good energy matching relationship between the thermally activated delayed fluorescence material and the quantum-dot light-emitting material, a dominant mechanism of energy transfer from host molecules to guest molecules belongs to a long term foster type, that is, the triplet-singlet energy transfer. Based on the above-mentioned principle, the guest molecules may obtain not only the energy of the single excited state of the host generated directly, but also the energy of the triplet exciton converted into the singlet exciton via the RISC process. Theoretically, its internal quantum efficiency may also achieve 100%. As such, the exciton generated by the thermally activated delayed fluorescence material transfers the energy to the quantum-dot light-emitting material, which enhances the luminescence of the quantum-dot light-emitting material.

Since the thermally activated delayed fluorescence material mainly functions to enhance the energy transfer to the quantum-dot light-emitting material, optionally, the selection of the thermally activated delayed fluorescence material aims at the match of an energy level of the thermally activated delayed fluorescence material with that of the quantum-dot light-emitting material, such that the energy is transferred to the quantum-dot light-emitting material from the thermally activated delayed fluorescence material more effectively. Optionally, the thermally activated delayed fluorescence material has an emission spectrum matching with an absorption spectrum of the quantum-dot light-emitting material, thereby ensuring the emission of the white light of the electroluminescent device.

In the embodiment of the present disclosure, optionally, the blue-emitting thermally activated delayed fluorescence material doped with the quantum-dot light-emitting material is used as the light-emitting layer. The blue-emitting thermally activated delayed fluorescence material may be propiconazole-sulfobenzide (PPZ-DPS). The quantum-dot light-emitting material may be CdSe/ZnS, ZnSe:$Cu^{2+}$ quantum dots, or the like. With an applied voltage, the blue-emitting thermally activated delayed fluorescence material is excited to emit blue light, and excites the quantum-dot light-emitting material to emit red and green light. In the present embodiment, in addition to its blue-emissive property, the blue-emitting thermally activated delayed fluorescence material further transfers the energy of the excitons to the quantum-dot light-emitting material, so as to enable the quantum-dot light-emitting material to emit light. Due to its core/shell structure and special performance, the quantum-dot light-emitting material may emit the red and green light when excited by the blue light. After coordination of the thermally activated delayed fluorescence material and the quantum-dot light-emitting material, the blue, green and red lights are mixed to generate the white light. To sum up, the blue-emitting thermally activated delayed fluorescence material and the quantum-dot light-emitting material are taken as the light-emitting layer, which implements the quantum-dot electroluminescent device with a simple structure and emitting the white light due to the arrangement of a single light-emitting layer.

In some embodiments, the thermally activated delayed fluorescence material and the quantum-dot light-emitting material are solved into the organic solution, and the mixed solution is spin-coated on the hole transport layer to form one light-emitting layer. That is, the quantum-dot electroluminescent device which may emit the white light by arranging a single light-emitting layer is implemented.

Meanwhile, with the applied voltage, the quantum-dot light-emitting material is also excited, so electroluminescence generated by the excitation of the applied voltage and the electroluminescence excited by the blue-emitting thermally activated delayed fluorescence material occur in the quantum-dot light-emitting material simultaneously. By appropriately adjusting a doping ratio of the blue-emitting thermally activated delayed fluorescence material and the applied voltage, the luminous intensity of the quantum dot may be enhanced.

In another embodiment of the present disclosure, the light-emitting layer is made of a green-emitting thermally activated delayed fluorescence material and an orange quantum-dot light-emitting material. The thermally activated delayed fluorescence material emits green light, and the quantum-dot light-emitting material that emits orange light includes CdSe/ZnS, CdSe/CdS, CdTe, InAs/ZnS, or the like. Similar to the above-mentioned principle, the green-emitting thermally activated delayed fluorescence material may excite the quantum-dot light-emitting material to emit red light, and thus emit the white light by appropriately adjusting the doping ratio.

In the light-emitting layer according to the present disclosure, the proportion of the quantum-dot light-emitting material to the thermally activated delayed fluorescence material is 0.1%-50% by mass. The doping ratio may be adjusted as needed. In the case that the blue-emitting thermally activated delayed fluorescence material is doped with the quantum-dot light-emitting material, preferably, the ratio of the quantum-dot light-emitting material to the thermally activated delayed fluorescence material in mass is 1% to 5%, more preferably, 3% to 4%.

In the present disclosure, in addition to the above-mentioned light-emitting layer, the electroluminescent device further includes a cathode, an electron injection layer, an electron transport layer, a hole transport layer, a hole injection layer and an anode. Such structures coordinate with the light-emitting layer to realize the optimal light-emitting effect.

The electrode located at a light emission side, among the cathode and the anode, is a transparent electrode. Preferably, the anode is an ITO electrode, with a thickness in a range of 5 nm to 1000 nm, more preferably 100 nm to 300 nm. The cathode may be made of one or more of Al, LiF/Al, Ca, Ba, Ca/Al, Ag, and has a thickness ranging from 5 nm to 1000 nm, preferably, 100 nm to 200 nm.

Preferably, the electron injection layer is made of LiF, with a thickness in a range of 0.5 nm to 3 nm.

Preferably, the electron transport layer is made of metallic oxide, metal composite oxide, metal complex or organic matter, more preferably, ZnO, ZnMgO, 8-Hydroxyquinoline aluminum salt, 4,7-diphenyl-1,10-BPhen. Preferably, the electron transport layer has a thickness in a range of 20 nm to 500 nm, more preferably, 50 nm to 100 nm.

Preferably, the hole transport layer is made of any one of the following materials: (9,9-dioctylfluorene)-(4'-N-isobutylbenzene-diphenylamine) copolymer (TFB), poly-triphenyl diamine derivatives (poly-TPD), N,N'-diphenyl-N,N' (α-naphtyl)-1,1'-biphenyl-4,4'-diamine (NPD), and N,N'-diphenyl-N,N'-(1-naphthyl)-1,1'-biphenyl-4,4'-diamine (NPB). Preferably, the hole transport layer has a thickness in a range of 20 nm to 200 nm, more preferably, 30 nm to 80 nm.

Preferably, the hole injection layer is made of poly (3,4-ethylendioxythiophene)-poly (styrene sulfonic acid). Preferably, the hole injection layer has a thickness in a range of 1 nm to 100 nm, more preferably, 10 nm to 50 nm.

The present disclosure further provides a method for preparing a quantum-dot electroluminescent device, including following steps: providing a base substrate; preparing an anode on the base substrate; forming a hole injection layer on the anode; forming a hole transport layer on the hole injection layer; solving a thermally activated delayed fluorescence material and a quantum-dot light-emitting material in an organic solution, spin-coating a mixed solution on the hole transport layer, and obtaining a light-emitting layer after drying, wherein the thermally activated delayed fluorescence material and the quantum-dot light-emitting material are capable of emitting the white light by mixing together in proportion in case of excitation; forming an electron transport layer on the light-emitting layer; forming an electron injection layer on the electron transport layer; and preparing a cathode on the electron injection layer, to obtain the quantum-dot electroluminescent device.

The light-emitting layer is prepared by solving the thermally activated delayed fluorescence material and the quantum-dot light-emitting material into an organic solution, spin-coating the mixed solution on the hole transport layer, and obtaining the light-emitting layer after drying. In the present disclosure, the organic solution is not particularly limited, as long as it can solve the two above-mentioned materials. Preferably, the mixed solution has a concentration in a range of 5 mg/ml to 15 mg/ml, more preferably, 10 mg/ml. Preferably, a spin-coating speed is in a range of 2000 rpm to 3000 rpm, more preferably, 2500 rpm. The duration for the spin coating lasts for in a range of 45 to 70 seconds, more preferably, 60 seconds.

The method for preparing a quantum-dot electroluminescent device according to the present disclosure is simple and good in terms of repeatability.

The present disclosure further provides a display device, including the above-mentioned quantum-dot electroluminescent device.

In order to further understand the present disclosure, the quantum-dot electroluminescent device and its preparing method according to the present disclosure will be below explained in detail in combination with the embodiments, and the protection scope of the present disclosure is not limited by the following embodiments.

Optionally, the method for preparing a quantum-dot electroluminescent device according to some embodiments of the present disclosure includes the following steps.

In step 1) of cleaning a glass substrate including an ITO transparent electrode (anode), the glass substrate is cleaned by de-ionized water and ethyl alcohol and subjected to ultrasonic processing for 20 minutes, then is blow-dried quickly using a nitrogen gun, and undergoes an ozone treatment for 10 minutes, so as to clean the surface of the ITO electrode and increase a work function thereof.

In step 2) of manufacturing the hole injection layer, PEDOT:PSS is spin-coated on the cleaned glass substrate at a speed of 4000 rpm for 45 seconds in the air, and is subjected to annealing for 20 minutes at a temperature of 120 degrees Celsius in the air after the spin coating, to dry non-volatilized liquid.

In step 3) of manufacturing the hole transport layer, the PEDOT:PSS layer is transferred to a glove box, and a TFB solution (with a concentration of 10 mg/ml) is spin-coated on the PEDOT:PSS layer at a speed of 2000 rpm for 45 seconds and is subjected to annealing for 30 minutes at a temperature of 150 degrees Celsius in the glove box after the spin coating, to form the TFB layer.

In step 4) of manufacturing the light-emitting layer, after the annealing, a solution with a concentration of 10 mg/ml, doped with the quantum-dot light-emitting material and the blue-emitting material, is spin-coated at a speed of 2500 rpm for 60 seconds, wherein the quantum-dot light-emitting material has a CdSe/ZnS core/shell structure, the blue-emitting material is PPZ-DPS, and the quantum-dot light-emitting material is 1% the blue-emitting material in mass.

In step 5) of manufacturing the electron transport layer, a layer of ZnO ethanol solution with a concentration of 30 mg/ml is spin-coated on the formed light-emitting layer at a speed of 2000 rpm for 45 seconds.

In step 6) of manufacturing the electron injection layer, the device subjected to the spin coating is put in a vacuum evaporation cavity and is evaporated with LiF, so as to obtain the electron injection layer.

In step 7) of manufacturing the cathode, aluminum as the cathode is evaporated, to obtain the quantum-dot light-emitting material according to the embodiments.

Figure 3:
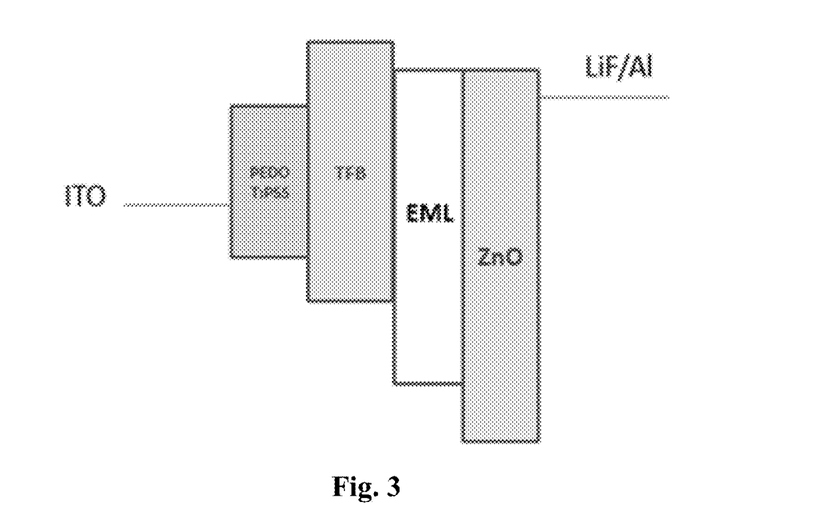
FIG. 3 is a structural schematic diagram of a quantum-dot electroluminescent device according to some embodiments of the present disclosure.

FIG. 3 is a structural schematic diagram of a quantum-dot electroluminescent device prepared according to the above-mentioned preparing method.

According to some embodiments of the present disclosure, the anode, the hole injection layer, and the hole transport layer are manufactured by the same method as the above-mentioned embodiment, so do the electron transport layer, the electron injection layer and the cathode. In manufacturing the light-emitting layer, after the annealing, a solution with a concentration of 10 mg/ml, doped with the quantum-dot light-emitting material and the blue-emitting material, is spin-coated at a speed of 2500 rpm for 60 seconds. The quantum-dot light-emitting material has a CdSe/ZnS core/shell structure, the blue-emitting material is PPZ-DPS, and the quantum-dot light-emitting material is 0%, 3%, 4%, 5% the blue-emitting material in mass respectively, wherein the quantum-dot light-emitting material being 0% the blue-emitting material in mass means to spin-coat the blue-emitting material solution after the annealing (excluding the quantum-dot light-emitting material).

Figure 4:
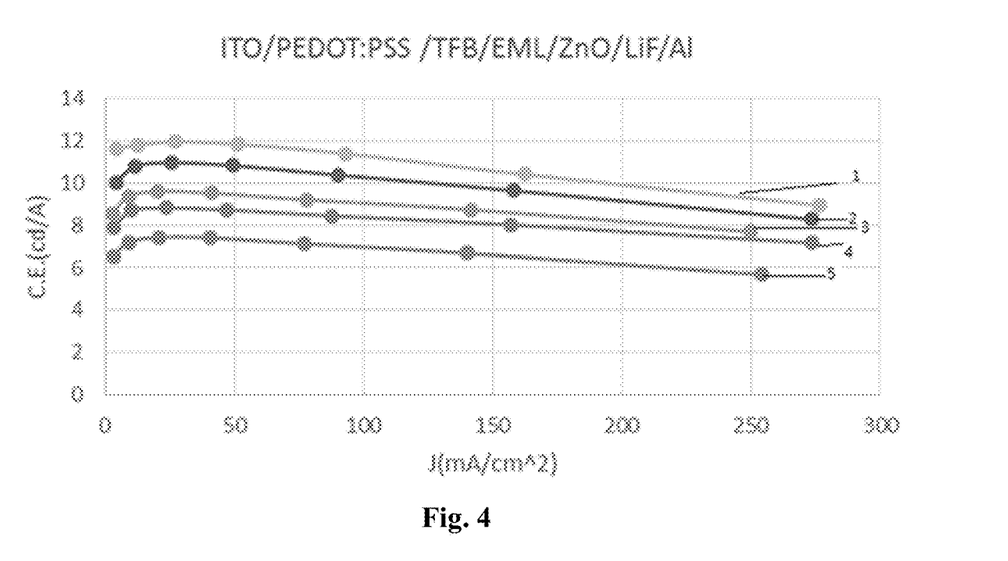
FIG. 4 is a schematic diagram showing a relationship between current efficiency and current density of a quantum-dot electroluminescent device according to some embodiments of the present disclosure.

FIG. 4 is a diagram showing a relationship between current efficiency and current density of the quantum-dot electroluminescent device prepared according to some embodiments of the present disclosure. In FIG. 4, the reference numeral 1 represents a current efficiency-current density curve of the quantum-dot electroluminescent device prepared in case that the quantum-dot light-emitting material is 4% the blue-emitting material in mass in the above-mentioned embodiment, the reference numeral 2 represents a current efficiency-current density curve of the quantum-dot electroluminescent device prepared in case that the quantum-dot light-emitting material is 5% the blue-emitting material in mass in the above-mentioned embodiment, the reference numeral 3 represents a current efficiency-current density curve of the quantum-dot electroluminescent device prepared in case that the quantum-dot light-emitting material is 3% the blue-emitting material in mass in the above-mentioned embodiment, the reference numeral 4 represents a current efficiency-current density curve of the quantum-dot electroluminescent device prepared in case that the quantum-dot light-emitting material is 1% the blue-emitting material in mass in the above-mentioned embodiment, and the reference numeral 5 represents a current efficiency-current density curve of the quantum-dot electroluminescent device prepared in case that the quantum-dot light-emitting material is 0% the blue-emitting material in mass in the above-mentioned embodiment. As shown in FIG. 4, the luminous efficiency is better in case that the proportion of the quantum-dot light-emitting material to the thermally activated delayed fluorescence material is 3-5% by mass.

Optionally, the method for preparing a quantum-dot electroluminescent device according to some embodiments of the present disclosure includes the following steps.

In step 1) of cleaning a glass substrate including an ITO transparent electrode (anode), the glass substrate is cleaned by de-ionized water and ethyl alcohol and subjected to ultrasonic processing for 20 minutes, then is blow-dried quickly using a nitrogen gun, and undergoes an ozone treatment for 10 minutes, so as to clean the surface of the ITO electrode and increase a work function thereof.

In step 2) of manufacturing the hole injection layer, PEDOT:PSS is spin-coated on the cleaned glass substrate at a speed of 4000 rpm for 45 seconds in the air and is subjected to annealing for 20 minutes at a temperature of 120 degrees Celsius in the air after the spin coating, to dry non-volatilized liquid.

In step 3) of manufacturing the hole transport layer, the PEDOT:PSS layer is transferred to a glove box, and a Merck HTL solution (with a concentration of 5 mg/ml) is spin-coated on the PEDOT:PSS layer at a speed of 3000 rpm for 45 seconds and is subjected to annealing for 10 minutes at a temperature of 190 degrees Celsius in the glove box after the spin coating, to form the Merck HTL layer.

In step 4) of manufacturing the light-emitting layer, after the annealing, a solution with a concentration of 10 mg/ml, doped with the quantum-dot light-emitting material and the blue-emitting material, is spin-coated at a speed of 2500 rpm for 60 seconds, wherein the quantum-dot light-emitting material has a CdSe/ZnS core/shell structure, the blue-emitting material is PPZ-DPS, and the quantum-dot light-emitting material is 1% the blue-emitting material in mass.

In step 5) of manufacturing the electron transport layer, a layer of ZnO ethanol solution with a concentration of 30 mg/ml is spin-coated on the formed light-emitting layer at a speed of 2000 rpm for 45 seconds.

In step 6) of manufacturing the electron injection layer, the device subjected to the spin coating is put in a vacuum evaporation cavity and is evaporated with LiF, so as to obtain the electron injection layer.

In step 7) of manufacturing the cathode, aluminum as the cathode is evaporated, to obtain the quantum-dot light-emitting material according to the embodiment.

Figure 5:
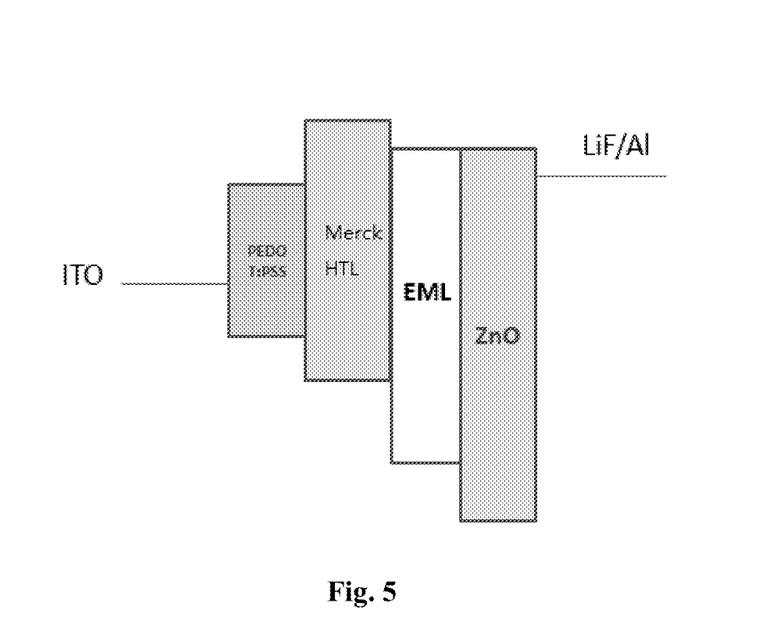
FIG. 5 is a structural schematic diagram of a quantum-dot electroluminescent device according to some embodiments of the present disclosure.

FIG. 5 is a structural schematic diagram of a quantum-dot electroluminescent device prepared according to the above-mentioned preparing method.

According to some embodiments of the present disclosure, the anode, the hole injection layer, and the hole transport layer are manufactured by the same method as the above-mentioned embodiment, so do the electron transport layer, the electron injection layer and the cathode. In manufacturing the light-emitting layer, after the annealing, a solution with a concentration of 10 mg/ml, doped with the quantum-dot light-emitting material and the blue-emitting material, is spin-coated at a speed of 2500 rpm for 60 seconds. The quantum-dot light-emitting material has a CdSe/ZnS core/shell structure, the blue-emitting material is PPZ-DPS, and the quantum-dot light-emitting material is 0%, 3%, 4%, 5% the blue-emitting material in mass respectively.

Figure 6:
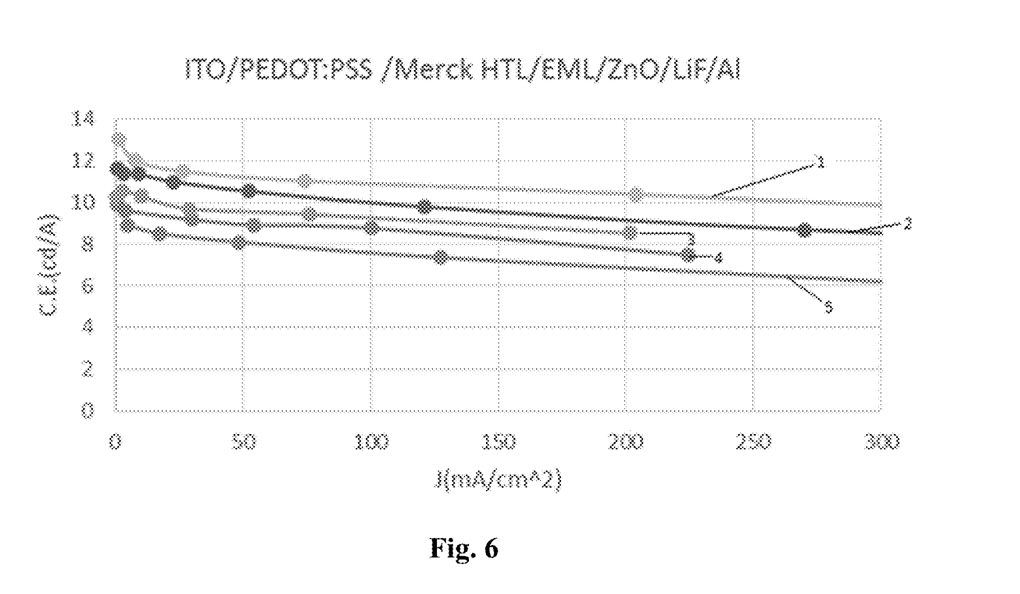
FIG. 6 is a schematic diagram showing a relationship between current efficiency and current density of a quantum-dot electroluminescent device according to some embodiments of the present disclosure.

FIG. 6 is a diagram showing a relationship between current efficiency and current density of the quantum-dot electroluminescent device prepared according to some embodiments of the present disclosure.

In FIG. 6, the reference numeral 1 represents a current efficiency-current density curve of the quantum-dot electroluminescent device prepared in case that the quantum-dot light-emitting material is 4% the blue-emitting material in mass in the above-mentioned embodiment, the reference numeral 2 represents a current efficiency-current density curve of the quantum-dot electroluminescent device prepared in case that the quantum-dot light-emitting material is 5% the blue-emitting material in mass in the above-mentioned embodiment, the reference numeral 3 represents a current efficiency-current density curve of the quantum-dot electroluminescent device prepared in case that the quantum-dot light-emitting material is 3% the blue-emitting material in mass in the above-mentioned embodiment, the reference numeral 4 represents a current efficiency-current density curve of the quantum-dot electroluminescent device prepared in case that the quantum-dot light-emitting material is 1% the blue-emitting material in mass in the above-mentioned embodiment, and the reference numeral 5 represents a current efficiency-current density curve of the quantum-dot electroluminescent device prepared in case that the quantum-dot light-emitting material is 0% the blue-emitting material in mass in the above-mentioned embodiment. As shown in FIG. 6, the luminous efficiency is better in case that the quantum-dot light-emitting material is 3-5% the thermally activated delayed fluorescence material in mass.

Optionally, the method for preparing a quantum-dot electroluminescent device according to some embodiments of the present disclosure includes the following steps.

In step 1) of cleaning a glass substrate including an ITO transparent electrode (anode), the glass substrate is cleaned by de-ionized water and ethanol and subjected to ultrasonic processing for 20 minutes, then is blow-dried quickly using a nitrogen gun, and undergoes an ozone treatment for 10 minutes, so as to clean the surface of the ITO electrode and increase a work function thereof.

In step 2) of manufacturing the hole injection layer, PEDOT:PSS is spin-coated on the cleaned glass substrate at a speed of 4000 rpm for 45 seconds in the air, and is subjected to annealing for 20 minutes at a temperature of 120 degrees Celsius in the air after the spin coating, to dry non-volatilized liquid.

In step 3) of manufacturing the hole transport layer, the PEDOT:PSS layer is transferred to a glove box, and a TFB solution (with a concentration of 10 mg/ml) is spin-coated on the PEDOT:PSS layer at a speed of 2000 rpm for 45 seconds and is subjected to annealing for 30 minutes at a temperature of 150 degrees Celsius in the glove box after the spin coating, to form the TFB layer.

In step 4) of manufacturing the light-emitting layer, after the annealing, a solution with a concentration of 10 mg/ml, doped with the quantum-dot light-emitting material and the blue-emitting material, is spin-coated at a speed of 2500 rpm for 60 seconds, wherein the quantum-dot light-emitting material has a CdSe/ZnS core/shell structure, the blue-emitting material is PPZ-DPS, and the quantum-dot light-emitting material is 1% the blue-emitting material in mass.

In step 5) of manufacturing the electron transport layer, a layer of ZnMgO ethanol solution with a concentration of 30 mg/ml is spin-coated on the formed light-emitting layer at a speed of 1500 rpm for 45 seconds.

In step 6) of manufacturing the electron injection layer, the device subjected to the spin coating is put in a vacuum evaporation cavity and is evaporated with LiF, so as to obtain the electron injection layer.

In step 7) of manufacturing the cathode, aluminum as the cathode is evaporated, to obtain the quantum-dot light-emitting material according to the embodiment.

Figure 7:
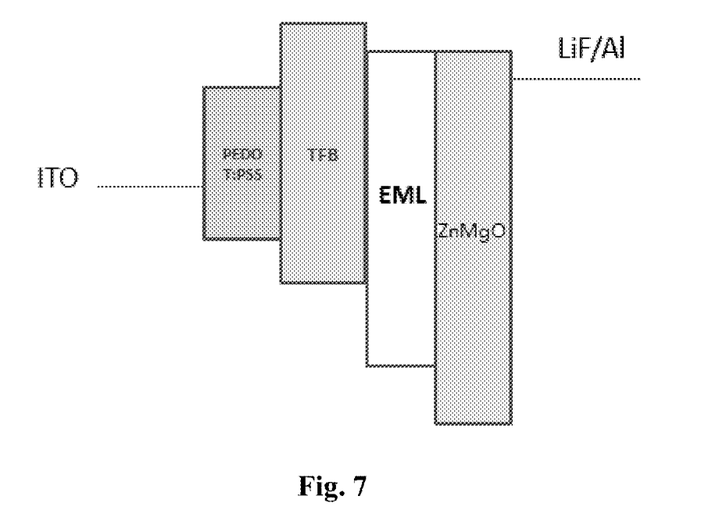
FIG. 7 is a structural schematic diagram of a quantum-dot electroluminescent device according to some embodiments of the present disclosure.

FIG. 7 is a structural schematic diagram of a quantum-dot electroluminescent device prepared according to the above-mentioned preparing method.

According to some embodiments of the present disclosure, the anode, the hole injection layer, and the hole transport layer are manufactured by the same method as the above-mentioned embodiment, so do the electron transport layer, the electron injection layer and the cathode. In manufacturing the light-emitting layer, after the annealing, a solution with a concentration of 10 mg/ml, doped with the quantum-dot light-emitting material and the blue-emitting material, is spin-coated at a speed of 2500 rpm for 60 seconds. The quantum-dot light-emitting material has a CdSe/ZnS core/shell structure, the blue-emitting material is PPZ-DPS, and the quantum-dot light-emitting material is 0%, 3%, 4%, 5% the blue-emitting material in mass respectively.

Figure 8:
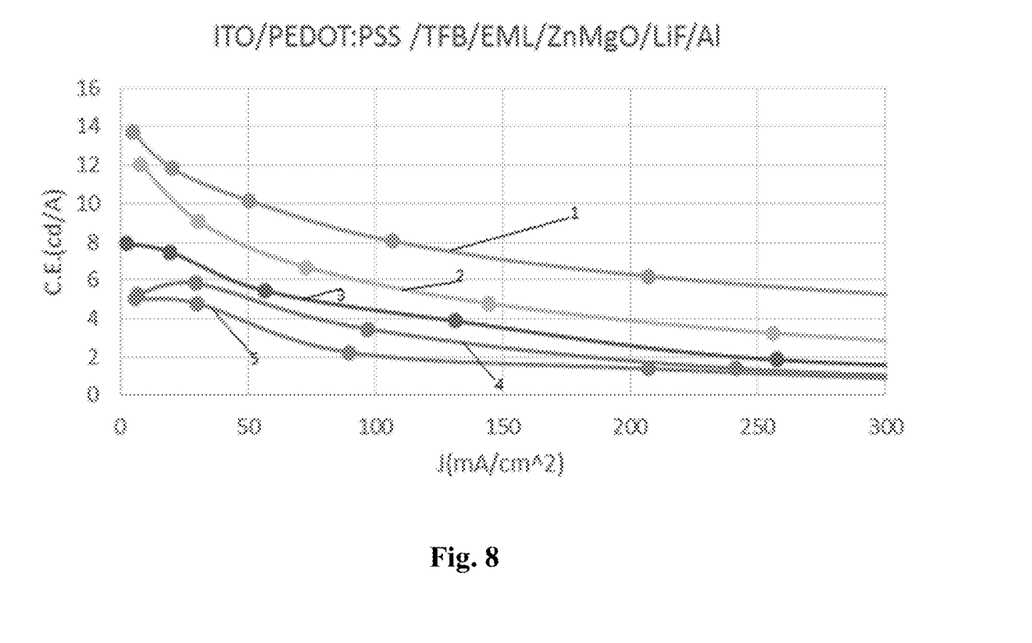
FIG. 8 is a schematic diagram showing a relationship between current efficiency and current density of a quantum-dot electroluminescent device according to some embodiments of the present disclosure.

FIG. 8 is a diagram showing a relationship between current efficiency and current density of the quantum-dot electroluminescent device prepared according to some embodiments of the present disclosure. In FIG. 8, the reference numeral 1 represents a current efficiency-current density curve of the quantum-dot electroluminescent device prepared in case that the quantum-dot light-emitting material is 3% the blue-emitting material in mass in the above-mentioned embodiment, the reference numeral 2 represents a current efficiency-current density curve of the quantum-dot electroluminescent device prepared in case that the quantum-dot light-emitting material is 4% the blue-emitting material in mass in the above-mentioned embodiment, the reference numeral 3 represents a current efficiency-current density curve of the quantum-dot electroluminescent device prepared in case that the quantum-dot light-emitting material is 5% the blue-emitting material in mass in the above-mentioned embodiment, the reference numeral 4 represents a current efficiency-current density curve of the quantum-dot electroluminescent device prepared in case that the quantum-dot light-emitting material is 1% the blue-emitting material in mass in the above-mentioned embodiment, and the reference numeral 5 represents a current efficiency-current density curve of the quantum-dot electroluminescent device prepared in case that the quantum-dot light-emitting material is 0% the blue-emitting material in mass in the above-mentioned embodiment. As shown in FIG. 8, the luminous efficiency is better in case that the quantum-dot light-emitting material is 3-5% the thermally activated delayed fluorescence material in mass.

Optionally, the method for preparing a quantum-dot electroluminescent device according to some embodiments of the present disclosure includes the following steps.

In step 1) of cleaning a glass substrate including an ITO transparent electrode (anode), the glass substrate is cleaned by de-ionized water and ethyl alcohol and subjected to ultrasonic processing for 20 minutes, then is blow-dried quickly using a nitrogen gun, and undergoes an ozone treatment for 10 minutes, so as to clean the surface of the ITO electrode and increase a work function thereof.

In step 2) of manufacturing the hole injection layer, PEDOT:PSS is spin-coated on the cleaned glass substrate at a speed of 4000 rpm for 45 seconds in the air and is subjected to annealing for 20 minutes at a temperature of 120 degrees Celsius in the air after the spin coating, to dry non-volatilized liquid.

In step 3) of manufacturing the hole transport layer, the PEDOT:PSS layer is transferred to a glove box, and a Merck HTL solution (with a concentration of 5 mg/ml) is spin-coated on the PEDOT:PSS layer at a speed of 3000 rpm for 45 seconds and is subjected to annealing for 10 minutes at a temperature of 190 degrees Celsius in the glove box after the spin coating, to form the Merck HTL layer.

In step 4) of manufacturing the light-emitting layer, after the annealing, a solution with a concentration of 10 mg/ml, doped with the quantum-dot light-emitting material and the blue-emitting material, is spin-coated at a speed of 2500 rpm for 60 seconds, wherein the quantum-dot light-emitting material has a CdSe/ZnS core/shell structure, the blue-emitting material is PPZ-DPS, and the quantum-dot light-emitting material is 1% the blue-emitting material in mass.

In step 5) of manufacturing the electron transport layer, a layer of ZnMgO ethanol solution with a concentration of 30 mg/ml is spin-coated on the formed light-emitting layer at a speed of 1500 rpm for 45 seconds.

In step 6) of manufacturing the electron injection layer, the device subjected to the spin coating is put in a vacuum evaporation cavity and is evaporated with LiF, so as to obtain the electron injection layer.

In step 7) of manufacturing the cathode, aluminum as the cathode is evaporated, to obtain the quantum-dot light-emitting material according to the embodiment.

Figure 9:
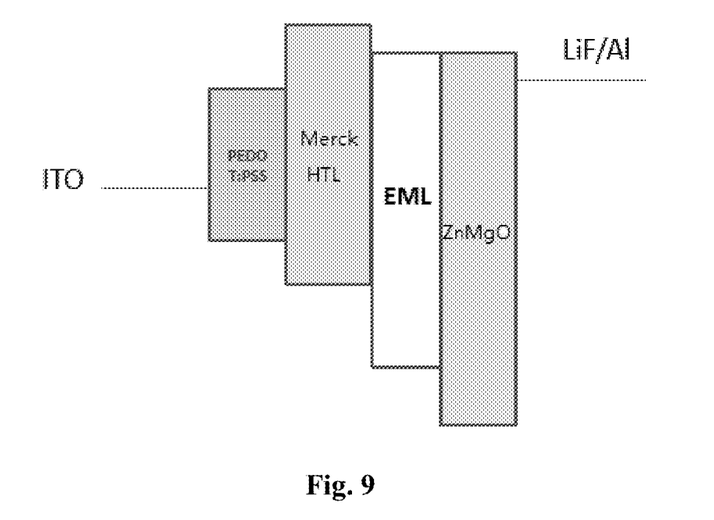
FIG. 9 is a structural schematic diagram of a quantum-dot electroluminescent device according to some embodiments of the present disclosure.

FIG. 9 is a structural schematic diagram of a quantum-dot electroluminescent device prepared according to the above-mentioned preparing method.

According to some embodiments of the present disclosure, the anode, the hole injection layer, and the hole transport layer are manufactured by the same method as the above-mentioned embodiment, so do the electron transport layer, the electron injection layer and the cathode. In manufacturing the light-emitting layer, after the annealing, a solution with a concentration of 10 mg/ml, doped with the quantum-dot light-emitting material and the blue-emitting material, is spin-coated at a speed of 2500 rpm for 60 seconds. The quantum-dot light-emitting material has a CdSe/ZnS core/shell structure, the blue-emitting material is PPZ-DPS, and the quantum-dot light-emitting material is 0%, 3%, 4%, 5% the blue-emitting material in mass respectively.

Figure 10:
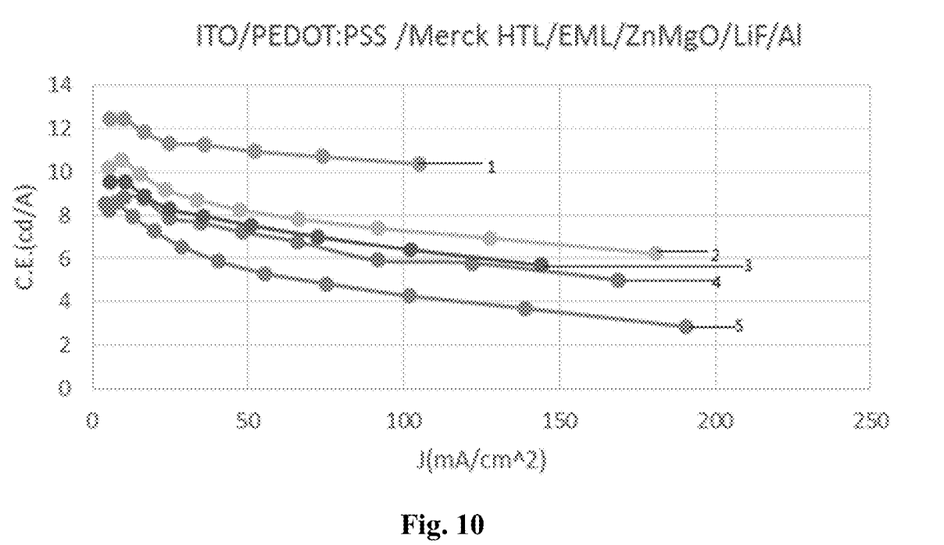
FIG. 10 is a schematic diagram showing a relationship between current efficiency and current density of the quantum-dot electroluminescent device according to some embodiments of the present disclosure.

FIG. 10 is a diagram showing a relationship between current efficiency and current density of the quantum-dot electroluminescent device prepared according to some embodiments of the present disclosure. In FIG. 10, the reference numeral 1 represents a current efficiency-current density curve of the quantum-dot electroluminescent device prepared in case that the quantum-dot light-emitting material is 3% the blue-emitting material in mass in the above-mentioned embodiment, the reference numeral 2 represents a current efficiency-current density curve of the quantum-dot electroluminescent device prepared in case that the quantum-dot light-emitting material is 4% the blue-emitting material in mass in the above-mentioned embodiment, the reference numeral 3 represents a current efficiency-current density curve of the quantum-dot electroluminescent device prepared in case that the quantum-dot light-emitting material is 5% the blue-emitting material in mass in the above-mentioned embodiment, the reference numeral 4 represents a current efficiency-current density curve of the quantum-dot electroluminescent device prepared in case that the quantum-dot light-emitting material is 1% the blue-emitting material in mass in the above-mentioned embodiment, and the reference numeral 5 represents a current efficiency-current density curve of the quantum-dot electroluminescent device prepared in case that the quantum-dot light-emitting material is 0% the blue-emitting material in mass in the above-mentioned embodiment. As shown in FIG. 10, the luminous efficiency is better in case that the quantum-dot light-emitting material is 3-5% the thermally activated delayed fluorescence material in mass.

The above-mentioned embodiments are merely to help understand the method and its core concepts of the present disclosure. It should be noted that several improvements and modifications may be made for a person skilled in the art without departing from the principle of the present disclosure, and also should be considered to fall within the protection scope of the present disclosure.

The above explanation of the disclosed embodiments make persons skilled in the art realize or use the present invention. Various modifications to the embodiments are obvious to persons skilled in the art. The general principles defined herein can be implemented in other embodiments without departing from the spirit or range of the present invention. Therefore, the present invention is not limited to the embodiments shown herein, but to conform to the widest range in line with the principles and novelty characteristics disclosed herein.

What is claimed is:

1. A quantum-dot electroluminescent device, comprising a light-emitting layer, wherein the light-emitting layer is made of a thermally activated delayed fluorescence material and a quantum-dot light-emitting material which are capable of emitting white light by mixing together in proportion in case of excitation;
   wherein the proportion of the quantum-dot light-emitting material to the thermally activated delayed fluorescence material is 3%-5% by mass.

2. The quantum-dot electroluminescent device according to claim 1, wherein the thermally activated delayed fluorescence material has an emission spectrum that matches an absorption spectrum of the quantum-dot light-emitting material.

3. The quantum-dot electroluminescent device according to claim 2, wherein the thermally activated delayed fluorescence material is capable of emitting blue light and exciting the quantum-dot light-emitting material to emit red and green light.

4. The quantum-dot electroluminescent device according to claim 3, wherein the thermally activated delayed fluorescence material is made of propiconazole-sulfobenzide, and the quantum-dot light-emitting material is made of CdSe/ZnS or ZnSe:$Cu^{2+}$.

5. The quantum-dot electroluminescent device according to claim 2, wherein the thermally activated delayed fluorescence material is capable of emitting green light, and the quantum-dot light-emitting material is capable of emitting orange light.

6. The quantum-dot electroluminescent device according to claim 1, further comprising a cathode, an electron injection layer, an electron transport layer, a hole transport layer, a hole injection layer and an anode, wherein the electron injection layer, the electron transport layer, the light-emitting layer, the hole transport layer and the hole injection layer are sequentially arranged between the cathode and the anode.

7. The quantum-dot electroluminescent device according to claim 6, wherein the electron transport layer is made of metallic oxide, metal composite oxide, metal complex or an organic material.

8. The quantum-dot electroluminescent device according to claim 6, wherein the electron transport layer has a thickness in a range of 20 nm to 500 nm.

9. The quantum-dot electroluminescent device according to claim 6, wherein the hole transport layer is made of any one of the following materials:
   (9,9-dioctylfluorene)-(4,4'-N-isobutylbenzene-diphenylamine) copolymer;
   poly-triphenyl diamine derivatives;
   N,N'-diphenyl-N,N' (α-naphthyl)-1,1'-biphenyl-4,4'-diamine; and
   N,N'-diphenyl-N,N'-(1-naphthyl)-1,1'-biphenyl-4,4'-di amine.

10. The quantum-dot electroluminescent device according to claim 6, wherein the hole transport layer has a thickness in a range of 20 nm to 200 nm.

11. The quantum-dot electroluminescent device according to claim 6, wherein the hole injection layer is made of poly (3,4-ethylendioxythiophene)-poly (styrene sulfonic acid).

12. The quantum-dot electroluminescent device according to claim 6, wherein the hole injection layer has a thickness in a range of 1 nm to 100 nm.

13. The quantum-dot electroluminescent device according to claim 6, wherein the electron injection layer has a thickness in a range of 0.5 to 3 nm, and the electron transport layer has a thickness in a range of 20 to 500 nm.

14. The quantum-dot electroluminescent device according to claim 6, wherein the anode has a thickness in a range of 100 nm to 300 nm, and the cathode has a thickness in a range of 100 nm to 200 nm.

15. A display device, comprising the quantum-dot electroluminescent device according to claim 6.

16. A method for preparing a quantum-dot electroluminescent device, comprising:
   providing a base substrate;
   preparing an anode on the base substrate;
   forming a hole injection layer on the anode;
   forming a hole transport layer on the hole injection layer;
   solving a thermally activated delayed fluorescence material and a quantum-dot light-emitting material in an organic solution, spin-coating a mixed solution on the hole transport layer, and obtaining a light-emitting layer after drying, wherein the thermally activated delayed fluorescence material and the quantum-dot light-emitting material are capable of emitting the white light by mixing together in proportion in case of excitation;
   forming an electron transport layer on the light-emitting layer;
   forming an electron injection layer on the electron transport layer; and
   preparing a cathode on the electron injection layer, to obtain the quantum-dot electroluminescent device;
   wherein the proportion of the quantum-dot light-emitting material to the thermally activated delayed fluorescence material is 3%-5% by mass.

17. The method according to claim 16, wherein the thermally activated delayed fluorescence material and the quantum-dot light-emitting material are solved in the organic solution, so as to prepare the mixed solution with a concentration in a range of 5 mg/ml to 15 mg/ml.

18. The method according to claim 16, wherein the forming a hole transport layer on the hole injection layer comprises:
   spin-coating a solution for preparing the hole transport layer on the hole injection layer at a speed ranging from 2000 to 4000 rpm.

* * * * *